(12) United States Patent
Trifonov (10) Patent No.: US 7,586,368 B2
(45) Date of Patent: Sep. 8, 2009

(54) SIMULTANEOUS FILTERING AND COMPENSATION CIRCUITRY AND METHOD IN CHOPPING AMPLIFIER

(75) Inventor: Dimitar T. Trifonov, Vail, AZ (US)

(73) Assignee: Texas Instruments Incorproated, Dallas, TX (US)

( * ) Notice: Subject to any disclaimer, the term of this patent is extended or adjusted under 35 U.S.C. 154(b) by 82 days.

(21) Appl. No.: 12/001,853

(22) Filed: Dec. 13, 2007

(65) Prior Publication Data
US 2009/0153241 A1 Jun. 18, 2009

(51) Int. Cl.
*H03F 1/02* (2006.01)
(52) U.S. Cl. .......................................... 330/9; 327/124
(58) Field of Classification Search ................ 330/9, 330/69; 327/124, 307
See application file for complete search history.

(56) References Cited

U.S. PATENT DOCUMENTS 7,262,654 B2 * 8/2007 Kejariwal et al. ............... 330/9
7,292,095 B2    11/2007 Burt et al.
7,446,602 B2 * 11/2008 Yoshikawa ..................... 330/9
7,518,440 B1 *  4/2009 Trifonov ........................ 330/9

* cited by examiner

*Primary Examiner*—Robert Pascal
*Assistant Examiner*—Hieu P Nguyen
(74) *Attorney, Agent, or Firm*—John J. Patti; Wade J. Brady, III; Frederick J. Telecky, Jr.

(57) ABSTRACT

A chopper-stabilized amplifier (1B) having a first output (25) includes an input chopper (9) for chopping an input signal and applying it to the input of a first amplifier (2) and an output chopper (10) for chopping an output signal of the first amplifier and applying it to the input of a switched capacitor notch filter (30-1). Notch filtering of the chopped output signal is performed by coupling a first compensation capacitor (C2) between a first output (25) of the chopper-stabilized amplifier and an output (14A) of the output chopper by means of a first switch (55) in response to a filter clock (FILTERCLK) and coupling a second compensation capacitor (C3) between the first output and an input (22A) of a second amplifier (3) by means of a second switch (58) in response to the filter clock, and coupling the first compensation capacitor between the first output and the input of the second amplifier by means of a third switch (56) in response to the complement of the filter clock and coupling the second compensation capacitor between the first output and the output (14A) of the output chopper circuit (40) by means of a fourth switch (57) in response to the complement.

20 Claims, 6 Drawing Sheets

SIMULTANEOUS FILTERING AND COMPENSATION CIRCUITRY AND METHOD IN CHOPPING AMPLIFIER

BACKGROUND OF THE INVENTION

The present invention relates generally to chopper stabilized amplifiers, and more particularly to circuitry and techniques for reducing the amount chip area occupied by capacitors used for Miller compensation and notch filtering.

Chopper stabilization is frequently used to improve offset and drift of amplifiers because it provides low in-band noise and avoids noise folding problems. A known technique for notch filtering can be used in chopper stabilized amplifiers to nearly eliminate the substantial output ripple voltage that otherwise occurs, and preserves the low offset, drift, and noise that are characteristic of the basic chopper stabilized amplifier topology. This known technique is described in the commonly assigned pending patent application Ser. No. 11/340,223 filed Jan. 26, 2006, entitled "Notch Filter for Ripple Reduction and Chopper Stabilized Amplifiers" by Rodney T. Burt and Joy Y. Zhang, incorporated herein by reference. However, increases bandwidth of a notch filtered chopper stabilized amplifier requires higher transconductance Gm in the chopping circuitry and accordingly requires larger compensation capacitors and larger capacitors in the notch filter. At higher bandwidths, the physical size of the compensation capacitors and notch filter capacitors causes them to occupy an unacceptably large amount of integrated circuit chip area, which unacceptably increases the cost of the chopper stabilized amplifier. This limits the usability of the otherwise highly desirable notch filtered chopper stabilized amplifier architecture in complex mixed signal systems in which it would be highly desirable to include a number of such amplifiers on a single integrated circuit chip.

Figure 1:
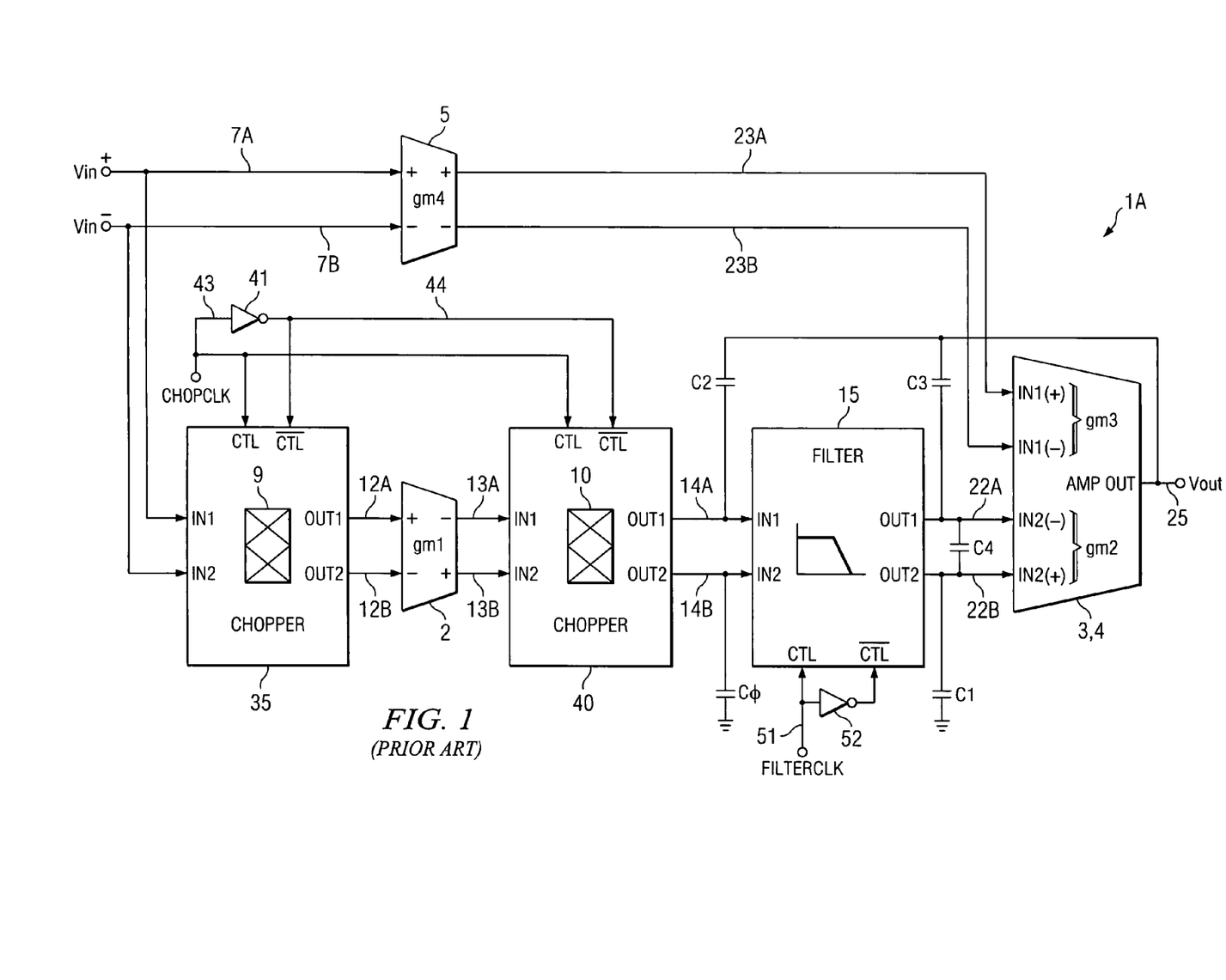
FIG. 1 is a schematic drawing of a prior art chopper stabilized amplifier including a notch filter.

"Prior Art" FIG. 1 herein shows a somewhat simplified block diagram representation 1A of the same notch filtered chopper stabilized amplifier circuit shown in FIG. 3A of above mentioned pending application Ser. No. 11/340,223, including chopping circuitry, a notch filter and a feed forward stage. In Prior Art FIG. 1, feed-forward transconductance stage 5 is shown having a differential output between conductors 23A and 23B. Block 35 contains the input chopping switches 9, which are the same as switches 9-1,2,3,4 as shown in FIG. 3A of Ser. No. 11/340,223, coupled between the input voltage Vin and the inputs of a transconductance stage 2. Block 40 contains the output chopping switches 10, which are the same as switches 10-1,2,3,4 as shown in FIG. 3A of Ser. No. 11/340,223.

In Prior Art FIG. 1, chopping clock signal CHOPCLK on conductor 43 is applied to the control (CTL) inputs (not shown) of various input chopping switches 9 and various output chopping switches 10 and also is applied to the input of an inverter 41 which produces the logical complement of CHOPCLK and applies it to the $\overline{\text{CTL}}$ inputs (not shown) of various other input chopping switches 9 and the various other output chopping switches 10. CHOPCLK is the same as the "Phase1" clock signal shown in FIG. 3B of Ser. No. 11/340, 223, and the logical complement of CHOPCLK is the same as the "Phase2" clock signal in FIG. 3B of co-pending Ser. No. 11/340,223. The input chopping switches 9 and output chopping switches 10 typically are implemented by means of individual MOS transistors or CMOS transmission gates. Similarly, filter clock signal FILTERCLK on conductor 51 is applied to the CTL inputs (not shown) of various switches 16 and 21 in notch filter 15 and also is applied to the input of an inverter 52 which produces the logical complement of FIL-

2

TERCLK and applies it to the $\overline{\text{CTL}}$ inputs (not shown) of various switches 16 and 21 in notch filter 15, which can be the same as shown in FIG. 3A of Ser. No. 11/340,223.

FILTERCLK is the same as "Phase3" in FIG. 3B of the above mentioned Ser. No. 11/340,223, and the logical complement of FILTERCLK is the same as "Phase4" in FIG. 3B of co-pending Ser. No. 11/340,223. Transconductance stage 3 (of transconductance gm2) and transconductance stage 4 (of transconductance gm3) in FIG. 3A of Ser. No. 11/340,223 are combined in block 3,4 in Prior Art FIG. 1 herein, wherein the two inputs IN1(+) and IN1(−) are the inputs of the "gm3" transconductance stage and the two inputs IN2(+) and IN2(−) are the inputs of the "gm2" transconductance stage. Output conductor 25 is connected to the output of the circuitry in block 3,4. Specifically, in block 3,4 the output of transconductance amplifier 4, referred to herein as "transconductance amplifier gm3", in FIG. 3A of Ser. No. 11/340,223 is connected to Vout conductor 25. The (−) input of transconductance amplifier gm3 is connected by conductor 23 shown in FIG. 3A of Ser. No. 11/340,223 to the output of transconductance amplifier 5, to the output of transconductance amplifier 3, referred to herein as "transconductance amplifier gm2", shown in FIG. 3A of Ser. No. 11/340,223 and also to one terminal of capacitor C1 shown in FIG. 3A of Ser. No. 11/340,223, the other terminal of which is connected to Vout conductor 25. The (−) and (+) inputs of transconductance amplifier gm2 are connected to conductors 22A and 22B, respectively.

In Prior Art FIG. 1, capacitors C0 and C1 are balancing capacitors, also referred to herein as "symmetrical counterpart capacitors", to Miller compensation capacitors C2 and C3, respectively, and are provided to balance charge injection effects, to cancel a "zero" that would otherwise occur in the amplifier transfer characteristic, and also to provide good common mode rejection.

Figure 2:
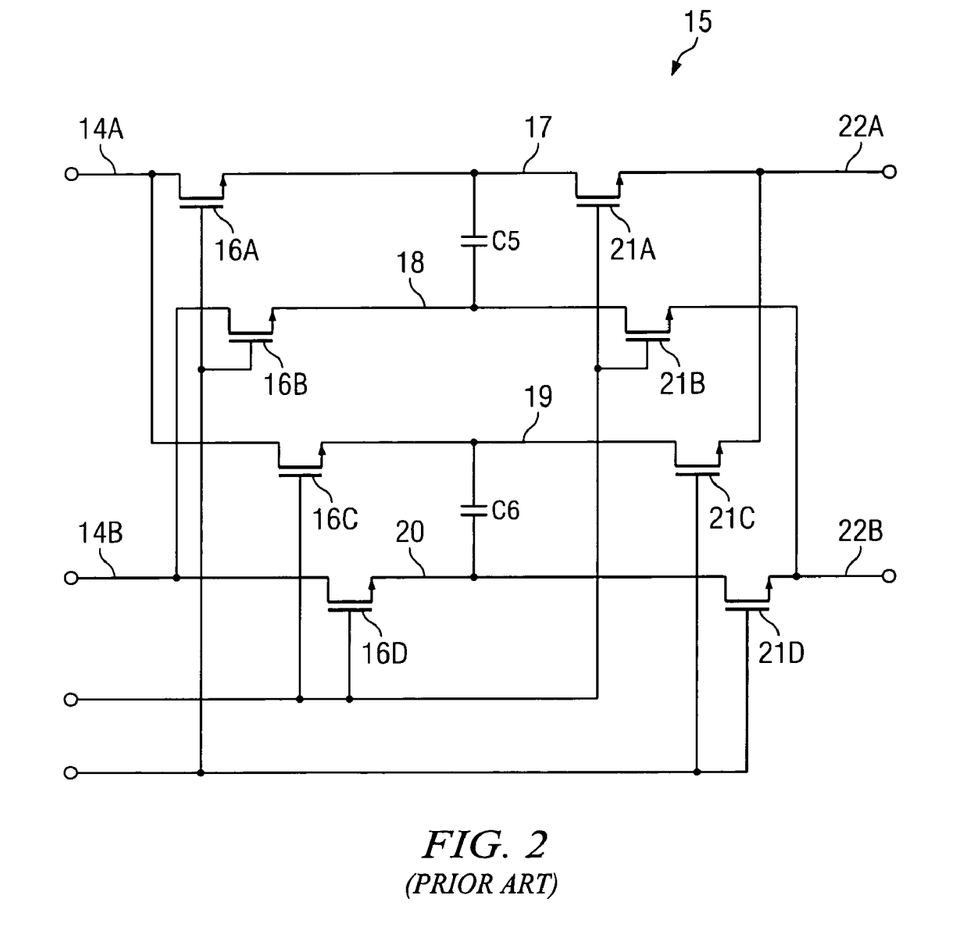
FIG. 2 is a schematic diagram of the notch filter in block 15 of FIG. 1.

FIG. 2 shows an implementation of the notch filter 15 shown in Prior Art FIG. 1, wherein the switches 16A-D and the switches 21A-D in FIG. 3A of Ser. No. 11/340,223 are implemented using N-channel MOS transistors.

Thus, there is an unmet need for circuitry in a chopper stabilized amplifier which substantially reduces the amount of integrated circuit chip area required for the various capacitors associated with notch filtering and Miller compensation within the chopper stabilized amplifier.

SUMMARY OF THE INVENTION

It is an object of the invention to provide a chopper stabilized amplifier circuit and method which substantially reduces the amount of integrated circuit chip area required for the various capacitors associated with notch filtering and Miller compensation within the chopper stabilized amplifier.

Briefly described, and in accordance with one embodiment, the present invention provides a chopper-stabilized amplifier (1B) having a first output (25) includes an input chopper (9) for chopping an input signal and applying it to the input of a first amplifier (2) and an output chopper (10) for chopping an output signal of the first amplifier and applying it to the input of a switched capacitor notch filter (30-1). Notch filtering of the chopped output signal is performed by coupling a first compensation capacitor (C2) between a first output (25) of the chopper-stabilized amplifier and an output (14A) of the output chopper (10) by means of a first switch (55) in response to a filter clock (FILTERCLK) and coupling a second compensation capacitor (C3) between the first output (25) and an input (22A) of a second amplifier (3) by means of a second switch (58) in response to the filter clock, and coupling the first compensation capacitor between the first output and the input of the second amplifier by means of a third switch (56) in response to the complement of the filter clock and coupling the second compensation capacitor between the first output (25) and the output (14A) of the output chopper circuit (40) by means of a fourth switch (57) in response to the complement of the filter clock.

In one embodiment, the invention provides a chopper-stabilized amplifier (1B) including a first amplifier (2), input chopper circuitry (9) coupled to an input (7A,B) of the amplifier (2) for chopping an input signal ($Vin^+$-$Vin^-$) and applying the chopped input signal to the input (12A,B) of the first amplifier (2), and output chopper circuitry (10) coupled to an output (13A,B) of the first amplifier (2) for chopping an output signal produced by the first amplifier (2). The first input chopper circuitry (9) and the output chopper circuitry (10) are clocked by a first clock signal (CHOPCLK). First (C2) and second (C3) compensation capacitors each have a first terminal coupled to an output (25) of the chopper-stabilized amplifier (1B). The switched capacitor notch filter circuitry (30-1) has an input (14A,B) coupled to an output of the output chopper circuitry (10) and performs an integrate and transfer function on a chopped output signal (14A) produced on a first output (14A) of the output chopper circuitry (10) by operating synchronously with a chopping frequency of the first clock signal (CHOPCLK) to notch-filter noise signals on the chopped output signal (14A). The first switched capacitor notch filter (15) is clocked by a second clock signal (FILTERCLK). The switched capacitor notch filter circuitry (30-1) further includes a first switch (55) for coupling a second terminal of the first compensation capacitor (C2) to the first output (14A) of the output chopper circuitry (10) in response to the second clock signal (FILTERCLK) and a second switch (56) for coupling the second terminal of the first compensation capacitor (C2) to a first input (22A) of a second amplifier (3) in response to a third clock signal ($\overline{FILTERCLK}$) which is out of phase with the second clock signal (FILTERCLK). A third switch (57) couples a second terminal of the second compensation capacitor (C3) to the first output (14A) of the output chopper circuitry (10) in response to the third clock signal ($\overline{FILTERCLK}$) and a fourth switch (58) couples the second terminal of the second compensation capacitor (C3) to the first input (22A) of the second amplifier (3) in response to the second clock signal (FILTERCLK). The output (25) of the chopper-stabilized amplifier (1B) is coupled to an output (23B) of the second amplifier (3).

In the described embodiment, the switched capacitor notch filter circuitry (30-1) further includes a fifth switch (59) for coupling a first balancing capacitor (C7) to a second output (14B) of the output chopper circuitry (10) in response to the second clock signal (FILTERCLK) and a sixth switch (60) for coupling the first balancing capacitor (C7) to a second input (22B) of the second amplifier (3) in response to the third clock signal ($\overline{FILTERCLK}$), and also includes a seventh switch (61) for coupling a second balancing capacitor (C8) to the second output (14B) of the output chopper circuitry (10) in response to the third clock signal ($\overline{FILTERCLK}$) and an eighth switch (62) for coupling the second balancing capacitor (C8) to the second input (22B) of the second amplifier (3) in response to the second clock signal (FILTERCLK). In the described embodiment, the first (2) and second (3) amplifiers are first (2) and second (3) transconductance amplifiers, respectively.

In the described embodiment, a third transconductance amplifier (4) has first (23A) and second (23B) inputs coupled to first (+) and second (−) outputs, respectively, of the second transconductance amplifier (3), and a fourth transconductance amplifier (5) has an input coupled to receive the input signal ($Vin^+$-$Vin^-$) and a first output (23A) coupled to the first input (+) of the third transconductance amplifier (4) and a second output (23B) coupled to the second input (−) of the third transconductance amplifier (4).

In one embodiment, the switched capacitor notch filter circuitry (30-2) further includes an additional notch filter (15A) having first and second inputs coupled to the first (14A) and second (14B) outputs of the output chopper circuitry (10) and first and second outputs coupled to the first (22A) and second (22B) inputs of the second amplifier (3).

In one embodiment, the switched capacitor notch filter circuitry (30-3) further includes additional notch filtering circuitry (15B) including a ninth switch (70) for coupling a first additional capacitor (C9) to the first output (14A) of the output chopper circuitry (10) in response to the second clock signal (FILTERCLK) and a tenth switch (71) for coupling the first additional capacitor (C9) to the first input (22A) of the second amplifier (3) in response to the third clock signal ($\overline{FILTERCLK}$), an eleventh switch (72) for coupling a second additional capacitor (C10) to the first output (14A) of the output chopper circuitry (10) in response to the third clock signal ($\overline{FILTERCLK}$) and a twelfth switch (73) for coupling the second additional capacitor (C10) to the first input (22A) of the second amplifier (3/gm2) in response to the second clock signal (FILTERCLK).

In one embodiment, the switched capacitor notch filter circuitry (30-4) further includes a first additional compensation capacitor (C11) connected between the output (25) of the chopper-stabilized amplifier (1E) and the first output (14A) of the output chopper circuitry (10), a second additional compensation capacitor (C12) connected between the output (25) of the chopper-stabilized amplifier (1E) and the first input (22A) of the second amplifier (3/gm2), a first additional balancing capacitor (C13) coupled to the second output (14B) of the output chopper circuitry (10), and a second additional balancing capacitor (C14) coupled to the second input (22B) of the second amplifier (3/gm2).

In the described embodiments, switching of the switched capacitor notch filter circuitry (30-1) is 90 degrees out of phase with the chopping of an output signal (13A,B) produced by the first amplifier (2), and the integrate and transfer functions are performed without loss of signal charge.

In one embodiment, the invention provides a method of operating a chopper-stabilized amplifier (1B) including performing a chopping/amplifying operation on an input signal ($Vin^+$-$Vin^-$) by chopping the input signal ($Vin^+$-$Vin^-$) in response to a first clock signal (CHOPCLK), applying the chopped input signal to an input of a first amplifier (2), and chopping an output signal produced by the first amplifier (2) by means of output chopper circuitry (10) in response to the first clock signal (CHOPCLK) to produce a chopped output signal (14A,B), operating switched capacitor notch filter circuitry (30-1) having an input coupled to receive the chopped output signal (14A,B) by performing an integrate and transfer function on the first chopped output signal (14A,B) synchronously with the first clock signal (CHOPCLK) and also in response to a second clock signal (FILTERCLK) to notch-filter noise signals in the first chopped output signal (14A,B), by coupling a first compensation capacitor (C2) between an output (25) of the chopper-stabilized amplifier (1B) and a first output (14A) of the output chopper circuitry (10) by means of a first switch (55) in response to the second clock signal (FILTERCLK) and coupling a second compensation capacitor (C3) between the output (25) of the chopper-stabilized amplifier (11B) and a first input (22A) of a second amplifier (3) by means of a second switch (58) in response to the second clock signal (FILTERCLK), and coupling the first compensation capacitor (C2) between the output (25) of the chopper-stabilized amplifier (1B) and the first input (22A) of the second amplifier (3) by means of a third switch (56) in response to a third clock signal ($\overline{\text{FILTERCLK}}$) which is out of phase with the second clock signal (FILTERCLK) and coupling the second compensation capacitor (C3) between the output (25) of the chopper-stabilized amplifier (1B) and the first output (14A) of the output chopper circuitry (10) by means of a fourth switch (57) in response to the third clock signal ($\overline{\text{FILTERCLK}}$).

In the described embodiment, the operating of the notched filter circuitry (30-1) also includes coupling a first balance capacitor (C7) between a reference voltage (GND) and a second output (14B) of the output chopper circuitry (10) by means of a fifth switch (59) in response to the second clock signal (FILTERCLK) and coupling a second balance capacitor (C8) between the reference voltage (GND) and a second input (22B) of the second amplifier (3) by means of a sixth switch (62) in response to the second clock signal (FILTERCLK), coupling the first balance capacitor (C7) between the reference voltage (GND) and the second input (22B) of the second amplifier (3) by means of a seventh switch (60) in response to the third clock signal ($\overline{\text{FILTERCLK}}$) and coupling the second balance capacitor (C8) between the reference voltage (GND) and the second output (14B) of the output chopper circuitry (10) by means of an eighth switch (61) in response to the third clock signal ($\overline{\text{FILTERCLK}}$). In one described embodiment, the switched capacitor notch filter circuitry (30-1) is clocked at a frequency which is the same as the frequency of the first clock signal (CHOPCLK). In another embodiment, the switched capacitor notch filter (30-1) is clocked at a frequency which is less than the frequency of the first clock signal (CHOPCLK).

In one embodiment, the invention provides a chopper-stabilized amplifier (1B) including means (9) for chopping an input signal (Vin$^+$-Vin$^-$) in response to a first clock signal (CHOPCLK), applying the chopped input signal to an input of a first amplifier (2), and means (10) for chopping an output signal produced by the first amplifier (2) in response to the first clock signal (CHOPCLK) to produce a chopped output signal (14A,B); and switched capacitor notch filter circuitry means (30-1) having an input coupled to receive the first chopped output signal (14A,B) for performing an integrate and transfer function on the chopped output signal (14A,B) synchronously with the first clock signal (CHOPCLK) and also in response to a second clock signal (FILTERCLK) to notch-filter noise signals in the first chopped output signal (14A,B), including means (55) for coupling a first compensation capacitor (C2) between an output (25) of the chopper-stabilized amplifier (1B) and a first output (14A) of the output chopper circuitry (10) in response to the second clock signal (FILTERCLK) and means (58) for coupling a second compensation capacitor (C3) between the output (25) of the chopper-stabilized amplifier (1B) and a first input (22A) of a second amplifier (3) in response to the second clock signal (FILTERCLK), and means (56) for coupling the first compensation capacitor (C2) between the output (25) of the chopper-stabilized amplifier (1B) and the first input (22A) of the second amplifier (3) in response to a third clock signal ($\overline{\text{FILTERCLK}}$) which is out of phase with the second clock signal (FILTERCLK) and means (57) for coupling the second compensation capacitor (C3) between the output (25) of the chopper-stabilized amplifier (1B) and the first output (14A) of the output chopper circuitry (10) in response to the third clock signal ($\overline{\text{FILTERCLK}}$). In the described embodiment, the notched filter circuitry (30-1) also includes means (59) for coupling a first balance capacitor (C7) between a reference voltage (GND) and a second output (14B) of the output chopper circuitry (10) in response to the second clock signal (FILTERCLK) and means (62) for coupling a second balance capacitor (C8) between the reference voltage (GND) and a second input (22B) of the second amplifier (3) in response to the second clock signal (FILTERCLK); and means (60) for coupling the first balance capacitor (C7) between the reference voltage (GND) and the second input (22B) of the second amplifier (3) in response to the third clock signal ($\overline{\text{FILTERCLK}}$) and means (61) for coupling the second balance capacitor (C8) between the reference voltage (GND) and the second output (14B) of the output chopper circuitry (10) in response to the third clock signal ($\overline{\text{FILTERCLK}}$).

DETAILED DESCRIPTION OF THE PREFERRED EMBODIMENTS

In accordance with the present invention, it was recognized that the capacitors within notch filter 15 of Prior Art FIG. 1 (i.e., capacitors C5 and C6 as shown in Prior Art FIG. 2) contribute very little to the overall compensation of chopper stabilized amplifier 1A, and similarly, Miller compensation capacitors C2 and C3 in Prior Art FIG. 1 contribute very little to the notch filtering. For a high-bandwidth implementation of chopper stabilized amplifier 1A in Prior Art FIG. 1, Miller compensation capacitors C2 and C3 and internal notch filter capacitors C5 and C6 occupy an undesirably large portion, e.g., as much as 40 to 60 percent, of the total integrated circuit chip area. Furthermore, if the chopper stabilized amplifier current is increased in order to increase the amplifier bandwidth, then even more capacitance is required for Miller compensation, and also for notch filtering (in order to keep voltages in notch filter 15 within predetermined limits).

In accordance with the present invention, the same integrated circuit capacitors are utilized to perform part or all of both the Miller compensation function and the notch filtering function. The same "symmetrical counterpart" or "balance" capacitors, which are provided to cancel charge injection in switched capacitor circuits, also are used to implement both the Miller compensation function and the notch filtering function.

Figure 3:
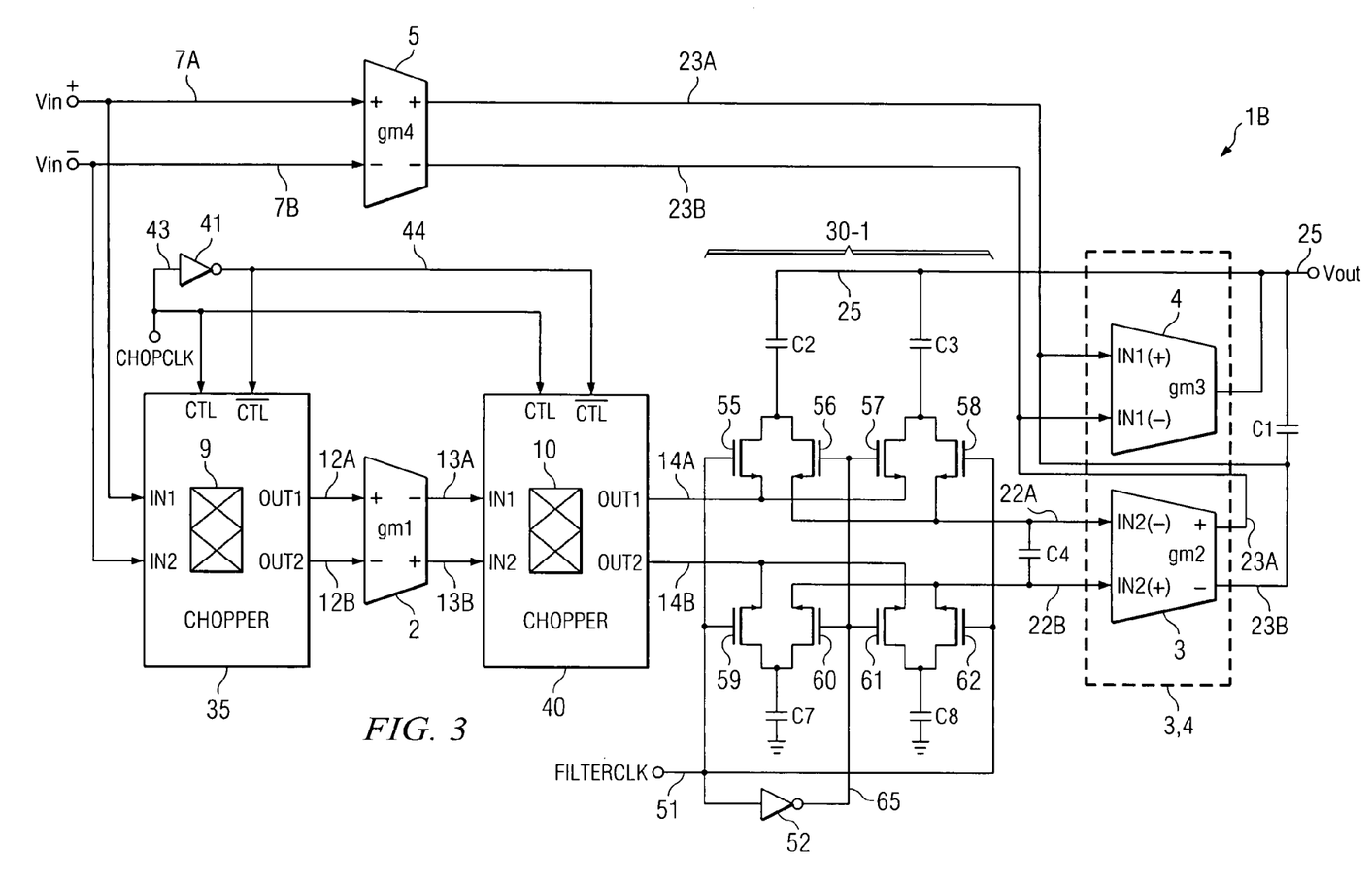
FIG. 3 is a schematic diagram of a chopper stabilized amplifier of the present invention.

FIG. 3 shows a chopper stabilized amplifier 1B in which the same capacitors are utilized both for notch filtering and Miller compensation in a combined compensation/notch-filtering circuit 30-1. Chopper stabilized amplifier 1B includes an input chopping circuit 35 including switches 9, a differential transconductance amplifier 2, an output chopping circuit 40 including switches 10, and compensation/notch-filtering circuit 30-1. An input signal Vin$^+$ is applied by means of conductor 7A to the (+) input of a differential feed forward transconductance amplifier 5 and the IN1 input of input chopping circuit 35. An input signal Vin⁻ is applied by means of conductor 7B to the (−) input of differential feed forward transconductance amplifier 5 and the IN2 input of input chopping circuit 35.

The first output OUT1 of input chopping circuit 35 and switches 9 is connected by means of conductor 12A to the (+) input of transconductance amplifier 2, which has transconductance gm1. The (+) output of transconductance amplifier 2 is connected by conductor 13B to the IN2 input of output chopping circuit 40. The output OUT2 of input chopping circuit 35 is connected by means of conductor 12B to the (−) input of transconductance amplifier 2, the (−) output of which is connected by conductor 13A to the IN1 input of output chopping circuit 40 and switches 10.

The output OUT1 of output chopping circuit 40 and switches 10 is connected by conductor 14A to the sources of N-channel MOS transistors 55 and 57 of compensation/notch-filtering circuit 30-1. Compensation/notch-filtering circuit 30-1 also includes N-channel MOS transistors 56, 58, 59, 60, 61 and 62, Miller compensation capacitors C2 and C3, and their corresponding balance capacitors C7 and C8. The gate of transistor 57 is connected by conductor 65 to receive the complement of filter clock signal FILTERCLK. The drain of transistor 55 is coupled to the drain of transistor 56 and to one terminal of compensation capacitor C2, the other terminal of which is connected to output conductor 25 on which the output signal Vout of chopper stabilized amplifier 1B is produced. The source of transistor 56 is connected by conductor 22A to the source of transistor 58 and the (−) input of transconductance amplifier 3 (which has transconductance gm2 and which may also be referred to as "transconductance amplifier gm2") in block 3,4. The gates of transistors 56 and 57 are connected by conductor 65 to receive the logical complement of FILTERCLK from an inverter 52. The drain of transistor 57 is connected to the drain of transistor 58 and to one terminal of compensation capacitor C3, the other terminal of which is connected to Vout conductor 25.

The output OUT2 of output chopping circuit 40 and switches 10 is connected to conductor 14B. Conductor 14B is connected to the sources of transistors 59 and 61. The gate of transistor 59 is connected by conductor 51 to receive FILTERCLK. The drain of transistor 59 is coupled to the drain of transistor 60 and to one terminal of balance capacitor C7, the other terminal of which is connected to ground. Balance capacitor C7 is the symmetrical counterpart corresponding to Miller capacitor C2. The source of transistor 60 is connected by conductor 22B to the source of transistor 62 and the IN2(+) input of the gm2 transconductance amplifier 3 in block 3,4. The gates of transistors 60 and 61 are connected by conductor 65 to receive the logical complement of FILTERCLK. The drain of transistor 61 is connected to the drain of transistor 62 and to one terminal of balance capacitor C8, the other terminal of which is connected to ground. The gates of transistors 58 and 62 are coupled by conductor 51 to receive FILTERCLK.

Output conductor 25 is connected to the output of a transconductance amplifier 4, which has transconductance gm3. Both transconductance amplifier 3, which has transconductance gm2, and transconductance amplifier 4 having transconductance gm3, are included in block 3,4 in FIG. 4. The (−) input of transconductance amplifier 4 is connected by conductor 23B to the (−) output of transconductance amplifier 5, to the (−) output of transconductance amplifier 3 and also to one terminal of capacitor C1 (as shown in FIG. 3A of above mentioned Ser. No. 11/340,223). The other terminal of capacitor C1 is connected to Vout conductor 25. The (−) and (+) inputs of transconductance amplifier 3 are connected to conductors 22A and 22B, respectively. The (+) output of transconductance amplifier 3 is connected to conductor 23A. The four transconductance stages shown in FIG. 3 can be implemented by means of conventional folded cascode stages.

As previously explained, capacitors C5 and C6 inside the notch filter 15 in Prior Art FIG. 1 (also shown in Prior Art FIG. 2 herein) transfer charge from the input of notch filter 15 to its output but have essentially no role in the Miller compensation, and Miller compensation capacitors C2 and C3 and their associated symmetrical counterpart capacitors have essentially no role in the notch filtering function. In contrast, in chopper stabilized amplifier 1B of FIG. 3, Miller compensation capacitors C3 and C2 are not directly connected to the input and the output of compensation/notch-filtering circuit 30-1. Instead, Miller compensation capacitors C2 and C3 in FIG. 3 are coupled to the output of output chopper 40 and the input of transconductance amplifier gm2 in block 3 by means of the various above described switching transistors 55, 56, 57, and 58 in response to FILTERCLK and its complement FILTERCLK. Similarly, Miller compensation balance capacitors C7 and C8 are coupled to the output of output chopper 40 and the input of the transconductance amplifier 3 by means of the various above described switching transistors 59, 60, 61 and 62 in response to FILTERCLK and FILTERCLK. The filter clock signal FILTERCLK and the chopping clock signal CHOPCLK are the same as in Prior Art FIG. 1.

In the relatively simple implementation of compensation/notch-filtering circuit 30-1 shown in above described FIG. 3, the Miller compensation capacitance is split into two equal parts, represented by capacitor C2 and capacitor C3, as are the corresponding balance capacitors C7 and C8. Charge from the outputs OUT1 and OUT2 of output chopper 40 and switches 10 therein are stored on these four capacitors, and compensation/notch-filtering circuit 30-1 then is operated so as to transfer the stored charge without loss to the inputs of transconductance amplifier 3, by transferring charge by means of compensation capacitors C2 and C3 and by means of balance capacitors C7 and C8 from the output of output chopper circuit 40 to the input of transconductance amplifier gm2 in block 3,4. The compensation capacitors C2 and C3 thus function in the notch filtering operation, while at the same time also functioning as Miller compensation capacitors so as to provide the required stability for chopper stabilized amplifier 1B. The configuration of compensation/notch-filtering circuit 30-1 in chopper stabilized amplifier 1B of FIG. 3 is useful if compensation/notch-filtering circuit 30-1 needs exactly the same amount of internal capacitance that is also required for the Miller circuit compensation.

In some cases, it may not be desirable to split the Miller compensation capacitance into two equal capacitances C2 and C3, and in some cases the amount of capacitance required for notch filtering exceeds the amount of capacitance required for Miller compensation, and in other cases the amount of capacitance required for notch filtering is less than the amount of capacitance required for Miller compensation.

For example, in many or most cases, the Miller compensation capacitors in FIG. 3 need to be split into unequal portions. Also, the capacitances of the capacitors in compensation/notch-filtering circuit 30-1 in FIG. 3 need to be either greater than or less than the capacitances of the Miller compensation capacitors C2 and C3. Then only the smaller portion, and also a smaller portion of the corresponding balance capacitor, can take part in the notch filtering function. If the capacitances of the notch filter capacitors need to be greater than the capacitances of the Miller compensation capacitors, then the Miller capacitors can be utilized to provide part of the capacitance needed in compensation/notch-filtering circuit 30-1, and the rest of the capacitance needed in compensation/notch-filtering circuit 30-1 can be added in the conventional way indicated in the diagram of notch filter 15 shown in Prior Art FIG. 2.

If the capacitances of Miller compensation capacitors C2 and C3 need to be greater than the capacitances of the capacitors in compensation/notch-filtering circuit 30-1, then it can be modified to include "split-off" portions of the modified Miller compensation capacitors, and the appropriate input and output conductors of the notch filter can remain directly connected to the lower terminals of a portion of the total Miller compensation capacitance (as indicated in subsequently described FIG. 5) to provide frequency compensation of chopper stabilized amplifier 1B (but not to transfer charge within the modified version of compensation/notch-filtering circuit 30-1).

Figure 4A:
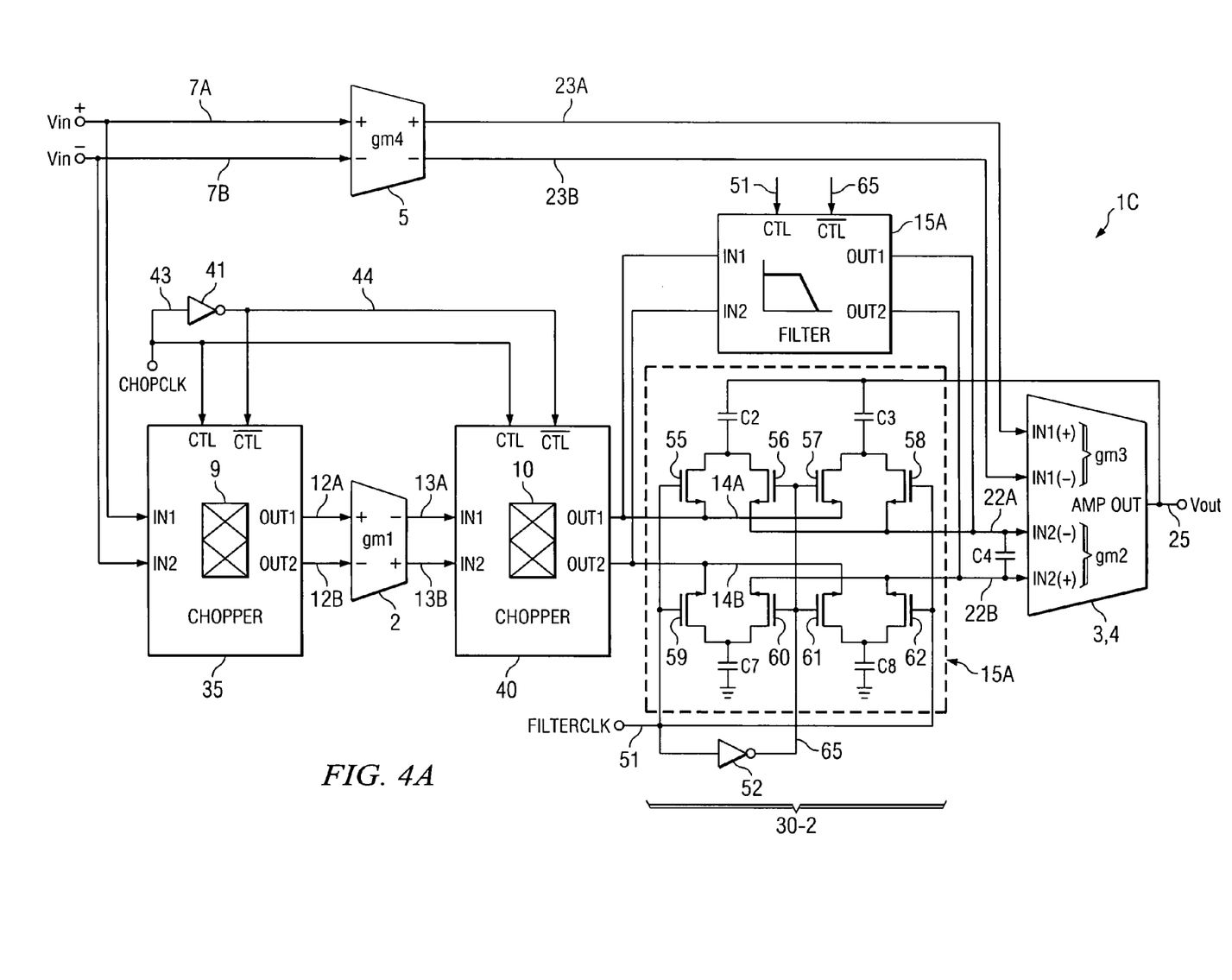
FIG. 4A is a schematic diagram of a variation of FIG. 3 wherein the various notch filter capacitances are greater than the various Miller compensation capacitances.

FIG. 4A shows a first way to modify compensation/notch-filtering circuit 30-1 of chopper stabilized operational amplifier 1B of FIG. 3 for the case in which the notch filter capacitances are greater than the Miller compensation capacitances thereof. This is accomplished in chopper stabilized operational amplifier 1C of FIG. 4A by further including an additional notch filter 15A to provide modified compensation/notch-filtering circuit 30-2 in FIG. 4A, so as to add the amount of notch filter capacitance not available from the Miller compensation capacitors. Additional notch filter 15A is identical to notch filter 15 of Prior Art FIG. 1 except that the notch filtering capacitances in notch filter 15A are half those in notch filter 15 of Prior Art FIGS. 1 and 2. The external connections of notch filter 15A to output chopping circuit 40 and transconductance amplifier gm2 in block 3,4 of FIG. 4A are exactly the same as in Prior Art FIG. 1.

The effect of additional notch filter 15A in FIG. 4A is to add additional notch filter capacitances (i.e., "flying capacitors" which are not connected to ground) between the outputs of output chopper switches 10 in block 40 and the corresponding inputs of transconductance amplifier gm2 in block 3,4. That is, the notch filtering capacitances in compensation/notch-filtering circuit 30-2 of FIG. 4A are formed of both the Miller compensation capacitors C2 and C3 and their corresponding balance capacitors C7 and C8 of compensation/notch-filtering circuit 30-1 and the internal capacitors in additional notch filter 15A, whereby only as much net capacitance is provided within additional notch filter 15A as is needed to implement the overall notch filter function in block 30-1. (However, the Miller compensation function in chopper stabilized amplifier 1C of FIG. 4A is performed only by compensation capacitors C2 and C3 and their corresponding symmetrical counterpart capacitors C7 and C8.)

Figure 4B:
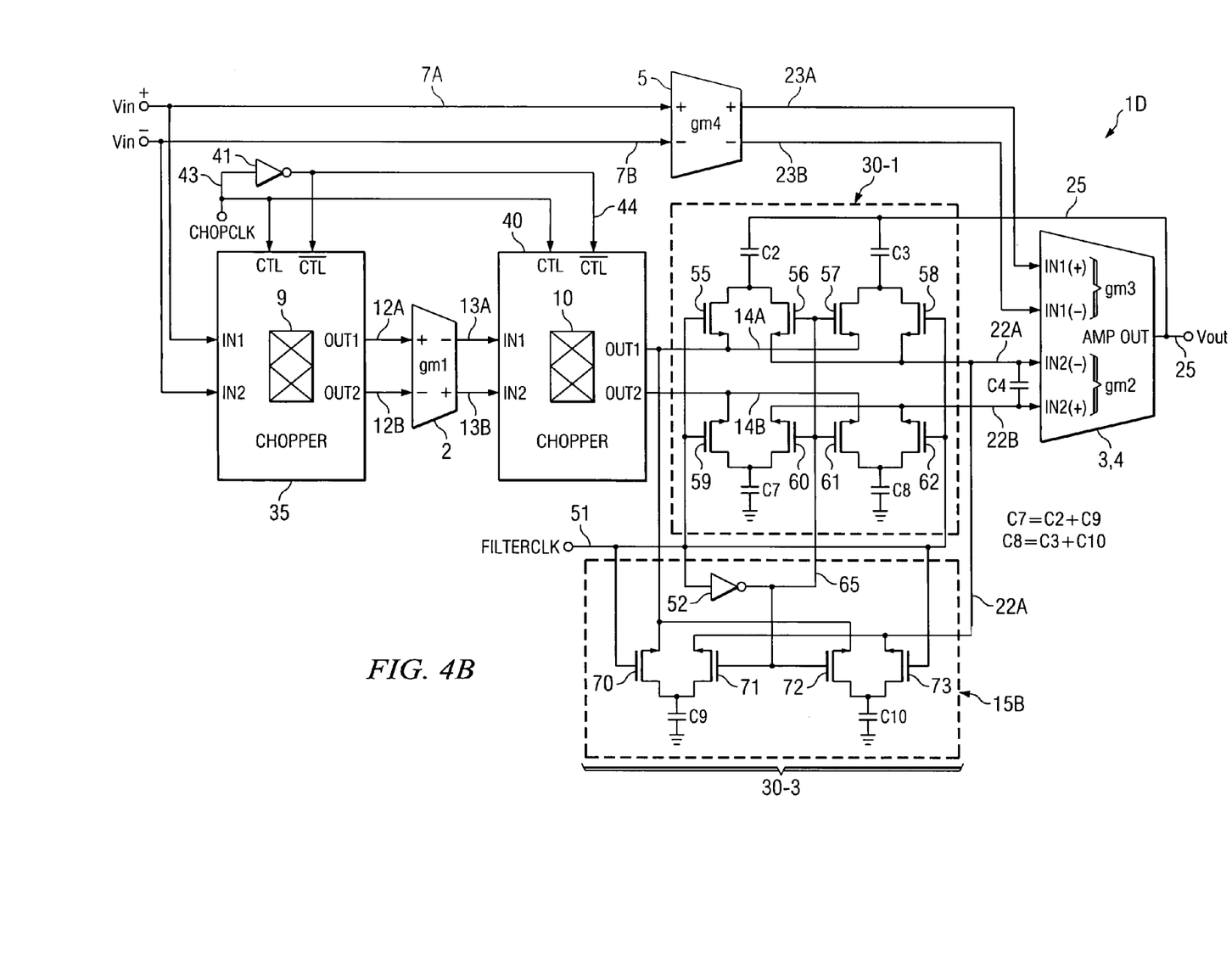
FIG. 4B is a schematic diagram of yet another variation of FIG. 3 wherein notch filter capacitances are greater than Miller compensation capacitances.

The schematic diagram of chopper stabilized amplifier 1D in FIG. 4B shows another way to modify compensation/notch-filtering circuit 30-1 of FIG. 3 for the case in which the notch filter capacitances are greater than the compensation capacitances. In FIG. 4B, modified compensation/notch-filtering circuit 30-3 is formed by both compensation/notch-filtering circuit 30-1 and additional notch filtering circuitry 15B. Additional notch filtering circuitry 15B includes N-channel transistors 70 and 72 having their sources connected to conductor 14A and N-channel transistors 72 and 73 having their sources connected to conductor 22A. The gates of transistors 70 and 73 are connected by conductor 51 to receive FILTERCLK, and the gates of transistors 71 and 72 receive the complement of FILTERCLK on conductor 65.

The drains of transistors 70 and 71 both are connected to one terminal of balance capacitor C9, the other terminal of which is connected to ground. The drains of transistors 72 and 73 are connected to one terminal of balance capacitor C10, the other terminal of which is connected to ground. The capacitances, and hence the sizes, of capacitors C7 and C8 are larger than those of capacitors C2 and C3 and are large enough to implement the notch filtering. The additional capacitance needed for the notch filtering function between the output of output chopper 40 and input of transconductance amplifier gm2 in block 3,4 is provided by capacitors C9 and C10, where C7=C2+C9 and C8=C3+C10. Thus, in FIG. 4B capacitors C2 and C3 implement the compensation function and in addition they also implement part of the notch filtering function, but since the amount of compensation capacitance is insufficient for the notch filtering process, additional capacitors C9 and C10, which contribute only to the notch filtering function, are provided. In addition to this, the capacitance of capacitors C7 and C8 is increased so that symmetrical charge injection is achieved and there is enough capacitance on conductors 14B and 22B to implement the required notch filtering function. (This is indicated by the expressions C7=C2+C9 and C8=C3+C10).

The capacitors referenced to ground are usually "poly/N-well" capacitors, i.e., silicon gate MOS capacitors, and therefore have a very high capacitance per unit area. Consequently, they occupy relatively small amounts of integrated circuit chip area. The capacitors such as C2 and C3 are usually poly-poly (polycrystalline silicon/oxide/polycrystalline silicon) capacitors or metal-metal capacitors, which have significantly lower capacitance per unit area, and therefore require much more chip area than MOS capacitors. By implementing the "additional" capacitors C9 and C10 (which are referenced to ground) as MOS capacitors, a substantial reduction of chip area is achieved by the implementation shown in FIG. 4B (as is also the case for the implementation shown in FIG. 4A).

Figure 5:
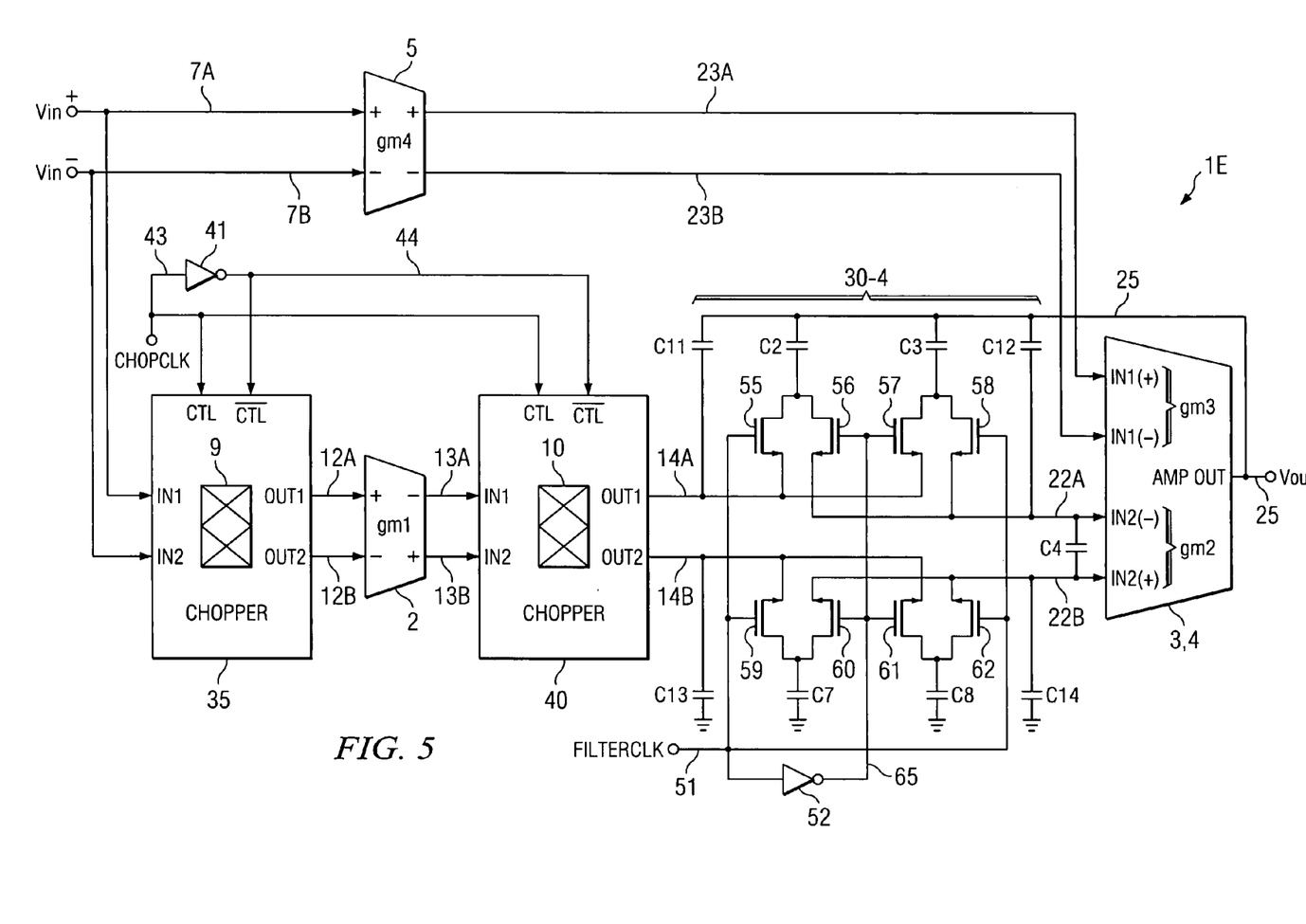
FIG. 5 is a schematic diagram of another variation of FIG. 3 for the case wherein notch filter capacitances are less than Miller compensation capacitances.

For the case in which the Miller compensation capacitance is greater than the required notch filtering capacitance, the structure of compensation/notch-filtering circuit 30-1 of above described FIG. 3 is modified to provide compensation/notch-filtering circuit 30-4 of chopper stabilized amplifier 1E in FIG. 5, by connecting an additional compensation capacitor C11 directly between Vout conductor 25 and conductor 14A, and by also connecting a corresponding balance capacitor C13 between conductor 14B and ground. Also, an additional compensation capacitor C12 is connected directly between Vout conductor 25 and conductor 22A, and a corresponding balance capacitor C14 is connected between conductor 22B and ground. In this way, parts of the compensation capacitances are directly connected to Vout so as to function only as compensation capacitors, and the other part of the compensation capacitances are used both for the Miller compensation function and for the notch filtering function.

A significant reduction in the amount of integrated circuit chip area is achieved by the notch filter implementations shown in each of a FIGS. 3, 4A, 4B and 5 as a result of simultaneously using the same capacitors for both the Miller compensation function and the notch filtering function, and in some cases an even greater reduction is achieved by including capacitors referenced to ground as poly-N-well capacitors, i.e., MOS capacitors.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, ordinary amplifiers (i.e., amplifiers other than a transconductance amplifiers) can be used instead of transconductance amplifiers. Also, some or all of the amplifiers can be single-ended amplifiers instead of differential amplifiers. But if it is desired to have the chopper stabilized amplifier well balanced and isolated from common mode charge injection, the symmetric differential approach is better. The compensation/notch-filtering circuit also could be single-ended. Also, although the output 25 of the described chopper stabilized amplifiers is illustrated as being single-ended; a differential output could be readily provided by providing a second output of transconductance amplifier 4 to provide a fully differential amplifier output. In this case, the lower terminals of the balance capacitors C7 and C8 would be connected to the second output of transconductance amplifier 4 instead of to ground.

What is claimed is:

1. A chopper-stabilized amplifier comprising:
   (a) a first amplifier,
   (b) input chopper circuitry coupled to an input of the amplifier for chopping an input signal and applying the chopped input signal to the input of the first amplifier;
   (c) output chopper circuitry coupled to an output of the first amplifier for chopping an output signal produced by the first amplifier, the first input chopper circuitry and the output chopper circuitry being clocked by a first clock signal;
   (d) first and second compensation capacitors each having a first terminal coupled to an output of the chopper-stabilized amplifier;
   (e) switched capacitor notch filter circuitry having an input coupled to an output of the output chopper circuitry and performing an integrate and transfer function on a chopped output signal produced on a first output of the output chopper circuitry by operating synchronously with a chopping frequency of the first clock signal to notch-filter noise signals on the chopped output signal, the first switched capacitor notch filter being clocked by a second clock signal, the switched capacitor notch filter circuitry further including
      (1) a first switch for coupling a second terminal of the first compensation capacitor to the first output of the output chopper circuitry in response to the second clock signal and a second switch for coupling the second terminal of the first compensation capacitor to a first input of a second amplifier in response to a third clock signal which is out of phase with the second clock signal, and
      (2) a third switch for coupling a second terminal of the second compensation capacitor to the first output of the output chopper circuitry in response to the third clock signal and a fourth switch for coupling the second terminal of the second compensation capacitor to the first input of the second amplifier in response to the second clock signal; and
   (f) the output of the chopper-stabilized amplifier being coupled to an output of the second amplifier.

2. The chopper-stabilized amplifier of claim 1 wherein the switched capacitor notch filter circuitry further includes
   (1) a fifth switch for coupling a first balancing capacitor to a second output of the output chopper circuitry in response to the second clock signal and a sixth switch for coupling the first balancing capacitor to a second input of the second amplifier in response to the third clock signal, and
   (2) a seventh switch for coupling a second balancing capacitor to the second output of the output chopper circuitry in response to the third clock signal and an eighth switch for coupling the second balancing capacitor to the second input of the second amplifier in response to the second clock signal.

3. The chopper-stabilized amplifier of claim 2 wherein the first and second amplifiers are first and second transconductance amplifiers, respectively.

4. The chopper-stabilized amplifier of claim 2 wherein the first through the eighth switches each include a MOS transistor, respectively.

5. The chopper-stabilized amplifier of claim 1 wherein the first and second compensation capacitors are of substantially equal capacitance.

6. The chopper-stabilized amplifier of claim 3 including a third transconductance amplifier having first and second inputs coupled to first and second outputs, respectively, of the second transconductance amplifier, and a fourth transconductance amplifier having an input coupled to receive the input signal and a first output coupled to the first input of the third transconductance amplifier and a second output coupled to the second input of the third transconductance amplifier.

7. The chopper-stabilized amplifier of claim 2 wherein the switched capacitor notch filter circuitry further includes an additional notch filter having first and second inputs coupled to the first and second outputs of the output chopper circuitry and first and second outputs coupled to the first and second inputs of the second amplifier.

8. The chopper-stabilized amplifier of claim 2 wherein the switched capacitor notch filter circuitry further includes additional notch filtering circuitry including a ninth switch for coupling a first additional capacitor to the first output of the output chopper circuitry in response to the second clock signal and a tenth switch for coupling the first additional capacitor to the first input of the second amplifier in response to the third clock signal, and
   (2) an eleventh switch for coupling a second additional capacitor to the first output of the output chopper circuitry in response to the third clock signal and a twelfth switch for coupling the second additional capacitor to the first input of the second amplifier in response to the second clock signal.

9. The chopper-stabilized amplifier of claim 2 wherein the switched capacitor notch filter circuitry further includes a first additional compensation capacitor connected between the output of the chopper-stabilized amplifier and the first output of the output chopper circuitry, a second additional compensation capacitor connected between the output of the chopper-stabilized amplifier and the first input of the second amplifier, a first additional balancing capacitor coupled to the second output of the output chopper circuitry, and a second additional balancing capacitor coupled to the second input of the second amplifier.

10. The chopper-stabilized amplifier of claim 1 wherein a load driven by the output of the switched capacitor notch filter circuitry includes a capacitance.

11. The chopper-stabilized amplifier of claim 1 wherein switching of the switched capacitor notch filter circuitry is 90 degrees out of phase with the chopping of an output signal produced by the first amplifier.

12. The chopper-stabilized amplifier of claim 1 wherein the integrate and transfer functions are performed without loss of signal charge.

13. A method of operating a chopper-stabilized amplifier comprising:
- (a) performing a chopping/amplifying operation on an input signal by chopping the input signal in response to a first clock signal, applying the chopped input signal to an input of a first amplifier, and chopping an output signal produced by the first amplifier by means of output chopper circuitry in response to the first clock signal to produce a chopped output signal; and
- (b) operating switched capacitor notch filter circuitry having an input coupled to receive the first chopped output signal by performing an integrate and transfer function on the chopped output signal synchronously with the first clock signal and also in response to a second clock signal to notch-filter noise signals in the first chopped output signal, by
  - (1) coupling a first compensation capacitor between an output of the chopper-stabilized amplifier and a first output of the output chopper circuitry by means of a first switch in response to the second clock signal and coupling a second compensation capacitor between the output of the chopper-stabilized amplifier and a first input of a second amplifier by means of a second switch in response to the second clock signal, and
  - (2) coupling the first compensation capacitor between the output of the chopper-stabilized amplifier and the first input of the second amplifier by means of a third switch in response to a third clock signal which is out of phase with the second clock signal and coupling the second compensation capacitor between the output of the chopper-stabilized amplifier and the first output of the output chopper circuitry by means of a fourth switch in response to the third clock signal.

14. The method of claim 13 wherein the operating of the notched filter circuitry includes
  - (1) coupling a first balance capacitor between a reference voltage and a second output of the output chopper circuitry by means of a fifth switch in response to the second clock signal and coupling a second balance capacitor between the reference voltage and a second input of the second amplifier by means of a sixth switch in response to the second clock signal, and
  - (2) coupling the first balance capacitor between the reference voltage and the second input of the second amplifier by means of a seventh switch in response to the third clock signal and coupling the second balance capacitor between the reference voltage and the second output of the output chopper circuitry by means of an eighth switch in response to the third clock signal.

15. The method of claim 13 wherein the switched capacitor notch filter circuitry is clocked at a frequency which is the same as the frequency of the first clock signal.

16. The method of claim 13 including clocking the switched capacitor notch filter at a frequency which is less than the frequency of the first clock signal.

17. The method of claim 14 including performing the integrate and transfer functions without loss of signal charge.

18. The method of claim 13 wherein switching of the switched capacitor notch filter circuitry is 90 degrees out of phase with the chopping of the output signal produced by the first transconductance amplifier.

19. A chopper-stabilized amplifier comprising:
- (a) means for chopping an input signal in response to a first clock signal, applying the chopped input signal to an input of a first amplifier, and means for chopping an output signal produced by the first amplifier in response to the first clock signal to produce a chopped output signal; and
- (b) switched capacitor notch filter circuitry means having an input coupled to receive the first chopped output signal for performing an integrate and transfer function on the chopped output signal synchronously with the first clock signal and also in response to a second clock signal to notch-filter noise signals in the first chopped output signal, including
  - (1) means for coupling a first compensation capacitor between an output of the chopper-stabilized amplifier and a first output of the output chopper circuitry in response to the second clock signal and means for coupling a second compensation capacitor between the output of the chopper-stabilized amplifier and a first input of a second amplifier in response to the second clock signal, and
  - (2) means for coupling the first compensation capacitor between the output of the chopper-stabilized amplifier and the first input of the second amplifier in response to a third clock signal which is out of phase with the second clock signal and means for coupling the second compensation capacitor between the output of the chopper-stabilized amplifier and the first output of the output chopper circuitry in response to the third clock signal.

20. The chopper stabilized amplifier of claim 19 wherein the notched filter circuitry includes
  - (1) means for coupling a first balance capacitor between a reference voltage and a second output of the output chopper circuitry in response to the second clock signal and means for coupling a second balance capacitor between the reference voltage and a second input of the second amplifier in response to the second clock signal; and
  - (2) means for coupling the first balance capacitor between the reference voltage and the second input of the second amplifier in response to the third clock signal and means for coupling the second balance capacitor between the reference voltage and the second output of the output chopper circuitry in response to the third clock signal.

* * * * *